US012613259B2

(12) United States Patent (10) Patent No.: US 12,613,259 B2

Meier et al. (45) Date of Patent: Apr. 28, 2026

(54) FLUIDIC WAFER PROBE

(71) Applicant: Texas Instruments Incorporated, Dallas, TX (US)

(72) Inventors: Sebastian Meier, Munich (DE); Helmut Bumberger, Marzling (DE); Heinrich Wachinger, Helfenbrunn (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 322 days.

(21) Appl. No.: 17/733,999

(22) Filed: Apr. 30, 2022

(65) Prior Publication Data

US 2023/0194569 A1 Jun. 22, 2023

Related U.S. Application Data

(60) Provisional application No. 63/292,762, filed on Dec. 22, 2021.

(51) Int. Cl.
| | |
|---|---|
| *G01R 1/067* | (2006.01) |
| *G01R 31/28* | (2006.01) |
| *H01L 21/66* | (2006.01) |

(52) U.S. Cl.
CPC ..... *G01R 1/06783* (2013.01); *G01R 31/2889* (2013.01); *H01L 22/14* (2013.01)

(58) Field of Classification Search
CPC . G01R 1/06783; G01R 31/2889; H01L 22/14; H01L 21/6715; G01N 33/1886; G01N 27/07; G01N 27/08; G01N 33/1893
See application file for complete search history.

(56) References Cited

U.S. PATENT DOCUMENTS

| | | | |
|---|---|---|---|
| 4,927,188 A | 5/1990 | Sands et al. | |
| 10,760,853 B1 | 9/2020 | Chandler et al. | |
| 2002/0048536 A1* | 4/2002 | Bergh | B01L 3/5025 |
| | | | 422/640 |
| 2007/0211244 A1 | 9/2007 | Hilmer et al. | |
| 2008/0038152 A1* | 2/2008 | Van Pelt | G01N 30/7266 |
| | | | 285/356 |
| 2008/0090314 A1* | 4/2008 | Ichihara | H01L 24/05 |
| | | | 257/E21.531 |
| 2012/0143531 A1 | 6/2012 | Davey et al. | |
| 2013/0255572 A1 | 10/2013 | Nettesheim et al. | |
| 2014/0134748 A1* | 5/2014 | Liu | G01N 27/3275 |
| | | | 422/63 |
| 2014/0239986 A1* | 8/2014 | Liu | G01N 27/4163 |
| | | | 324/750.01 |
| 2015/0316505 A1 | 11/2015 | Gordon et al. | |
| 2016/0370345 A1* | 12/2016 | Guia | G01N 31/22 |
| 2020/0185282 A1* | 6/2020 | Meier | G01N 27/07 |

(Continued)

*Primary Examiner* — Eman A Alkafawi
*Assistant Examiner* — Suresh K Rajaputra
(74) *Attorney, Agent, or Firm* — Ronald O. Neerings; Frank D. Cimino

(57) ABSTRACT

A wafer probe test system has a conductive needle configured to contact a conductive feature on a surface of a wafer, and a fluid probe having a multichannel tube, the fluid probe configured to engage the surface of the wafer to form a fluidic seal between a sensor face on the surface of the wafer and the conductive feature of the wafer, the multichannel tube having a first channel and a second channel configured to create a flow of fluid across the sensor face on the surface of the wafer.

16 Claims, 14 Drawing Sheets

(56)         References Cited

U.S. PATENT DOCUMENTS

| 2020/0249225 | A1* | 8/2020 | Mohanty | B01L 3/502707 |
|---|---|---|---|---|
| 2020/0254452 | A1* | 8/2020 | Erramilli | G01N 27/4148 |
| 2020/0292578 | A1* | 9/2020 | Mohanty | G01N 27/4145 |
| 2020/0388513 | A1* | 12/2020 | Reitinger | H01J 37/32724 |
| 2021/0020528 | A1* | 1/2021 | Meier | G01N 27/28 |
| 2022/0065811 | A1* | 3/2022 | Meier | G01N 1/38 |

* cited by examiner

Y
X 300
310    310    310    310    306
303
302
308
322
322
310
3C
322
316    332
322
310
320
314
310
322
330
322
310
310
310
322    322
301
304
Y
X
310    310    310    310    FIG. 3B
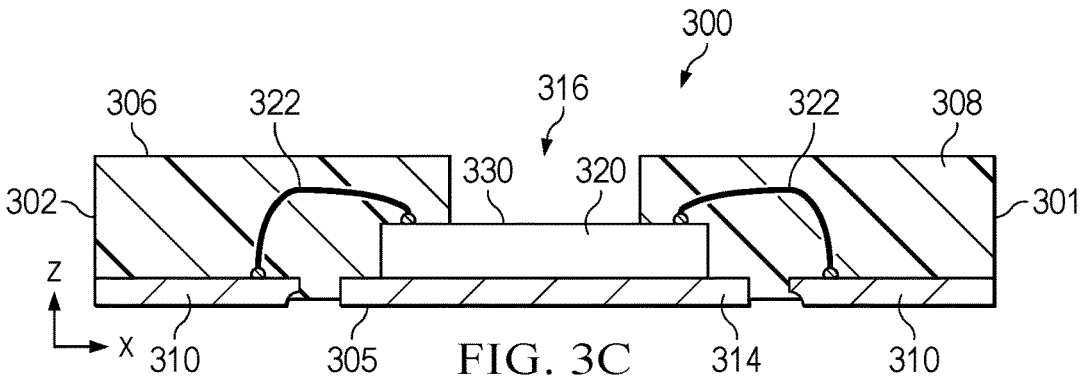
300
306    322    316    322    308
302    330    320    301
Z
X   310    305    FIG. 3C    314    310

FLUIDIC WAFER PROBE

CROSS-REFERENCE TO RELATED APPLICATION

This application claims priority to and benefit of U.S. Provisional Patent Application Ser. No. 63/292,762, filed on Dec. 22, 2021, and titled "TEST SETUP FOR WAFER LEVEL CHARACTERIZATION OF ELECTROCHEMICAL SENSORS USING MULTI-CHANNEL TUBE", the contents of which are hereby fully incorporated by reference.

BACKGROUND

Electronic sensors are electronic devices that sense an environmental condition of a fluid, such as a gas or liquid. Examples include corrosion sensors or other electrochemical sensors having an electrode that is used as a transducer element in the presence of an analyte of a fluid. Electrochemical sensors can be used to monitor physical, chemical, and/or biological parameters in a variety of applications, such as environmental monitoring, health and instrumentation sensors, and sensors related to machines or structures. Testing the operation of electrochemical sensors during manufacturing at the wafer level is difficult since the sensor circuitry often needs to be in contact with a fluid, whereas bond pads of the wafer need to be kept dry for electrical probing.

SUMMARY

In one aspect, a wafer probe test system includes a conductive needle and a fluid probe. The conductive needle is configured to contact a conductive feature on a surface of a wafer. The fluid probe has a multichannel tube. The fluid probe is configured to engage the surface of the wafer to form a fluidic seal between a sensor face on the surface of the wafer and the conductive feature of the wafer. The multichannel tube has a first channel and a second channel configured to create a flow of fluid across the sensor face on the surface of the wafer.

In another aspect, a method includes engaging a conductive feature on a surface of a wafer to a conductive needle, engaging a fluid probe to the surface of the wafer to form a fluidic seal between a sensor face on the surface of the wafer and the conductive feature of the wafer, using a multichannel tube of the fluid probe, creating a flow of fluid across the sensor face on the surface of the wafer, and using the conductive needle, performing an electrical test of a sensor circuit of the wafer while the fluid flows across the sensor face on the surface of the wafer.

In a further aspect, an electronic device includes a semiconductor die and a package structure. The semiconductor die has a surface, a conductive feature along a first portion of the surface, and a sensor face on a second portion of the surface. The package structure encloses the conductive feature of the semiconductor die and exposes second portion of the surface and a third portion of the surface between the first and second portions of the surface of the semiconductor die. The electronic device has a mark on the third portion of the surface of the semiconductor die.

BRIEF DESCRIPTION OF THE DRAWINGS

FIG. 1D is a partial sectional side elevation view of the fluid probe and conductive probe needles engaging a wafer in the wafer probe test system of FIG. 1.

FIG. 3B is a top view of the electronic device.

FIG. 3C is a sectional side elevation view of the electronic device taken along line 3C-3C of FIG. 3B.

DETAILED DESCRIPTION

Figure 1:
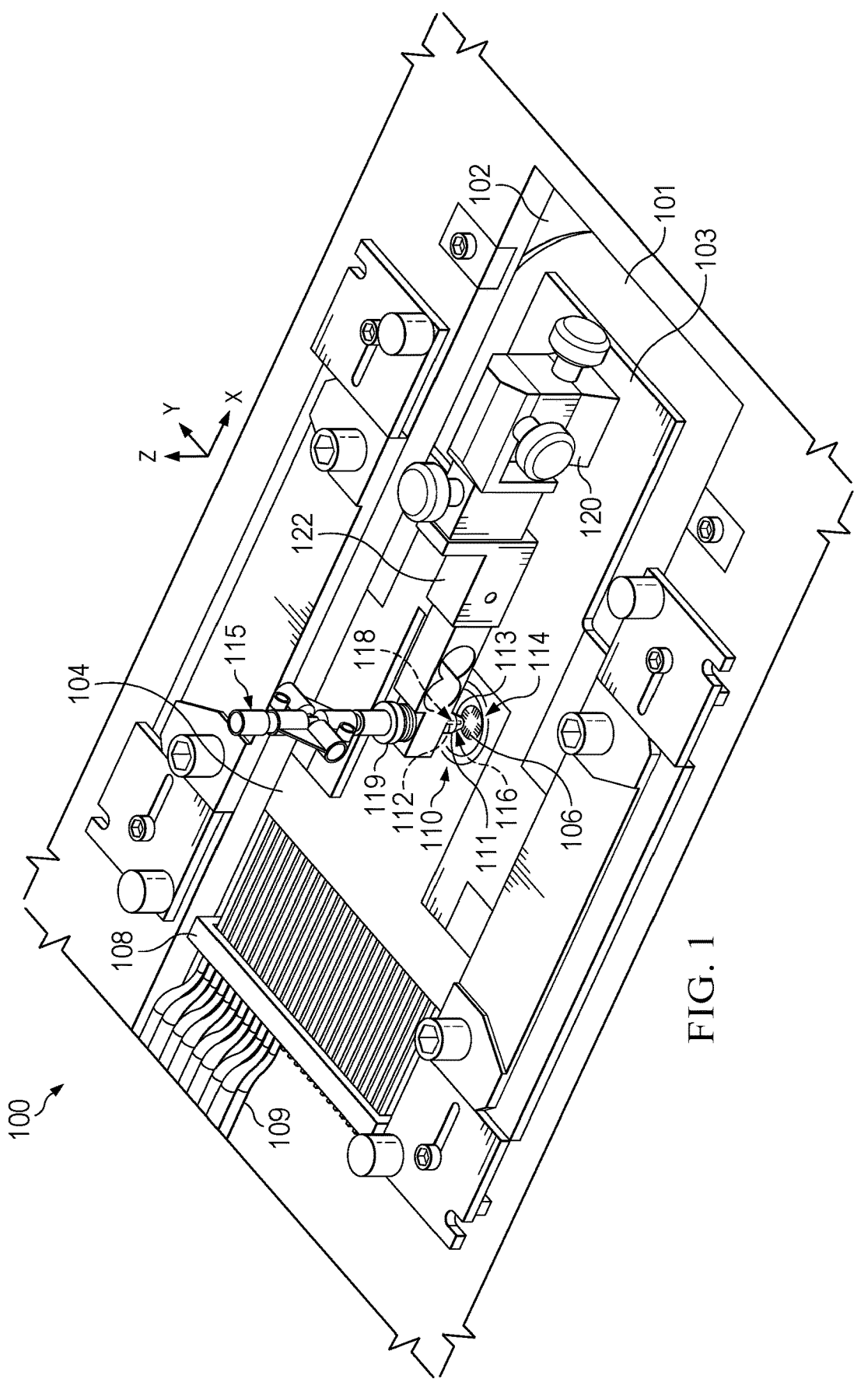
FIG. 1 is a top perspective view of a wafer probe test system with electrical probe needles and a fluid probe having a multichannel tube.
Figure 1A:
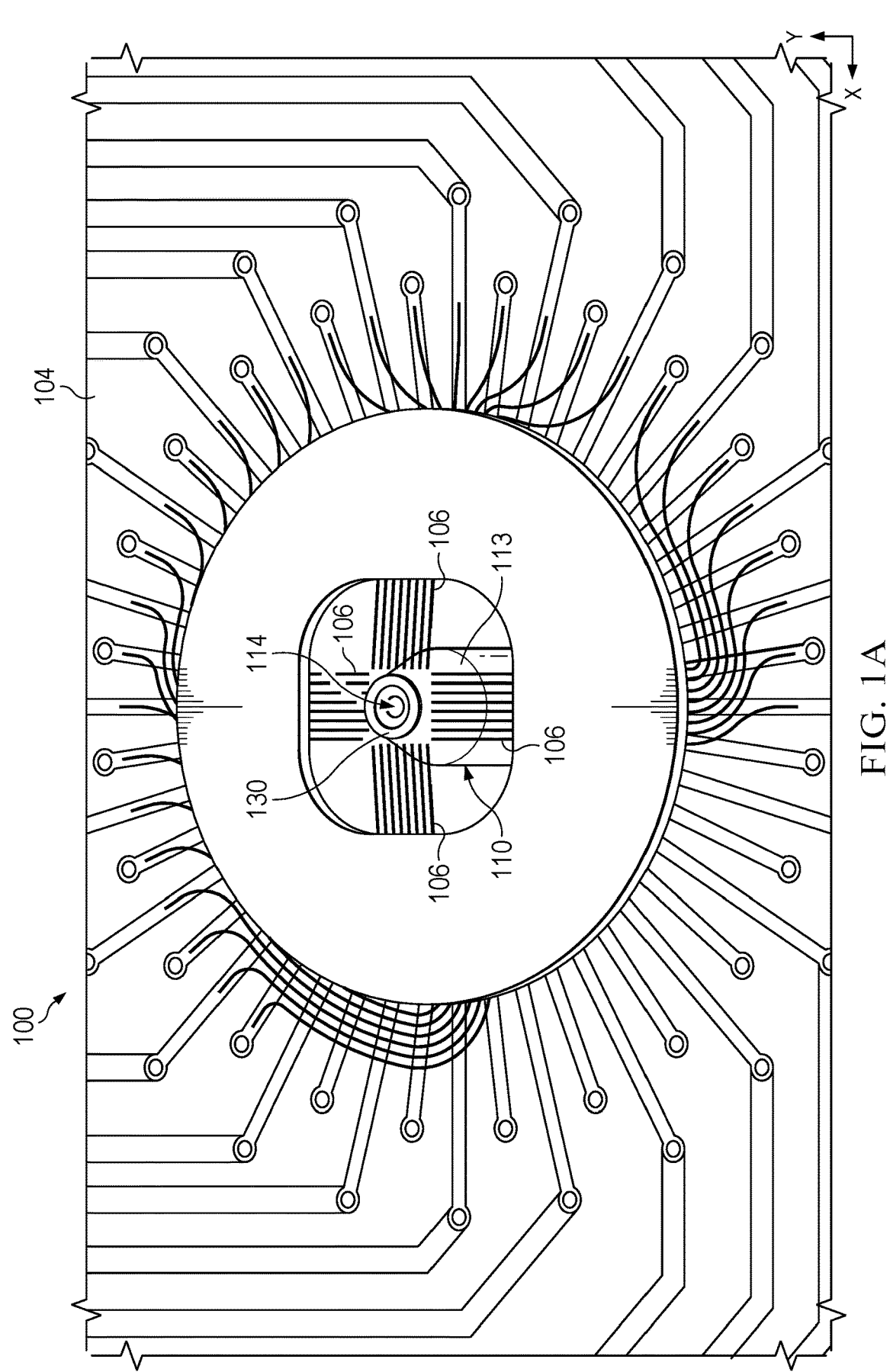
FIG. 1A is a partial bottom perspective view of a probe card having the electrical probe needles and fluid probe in the wafer probe test system of FIG. 1.
Figure 1B:
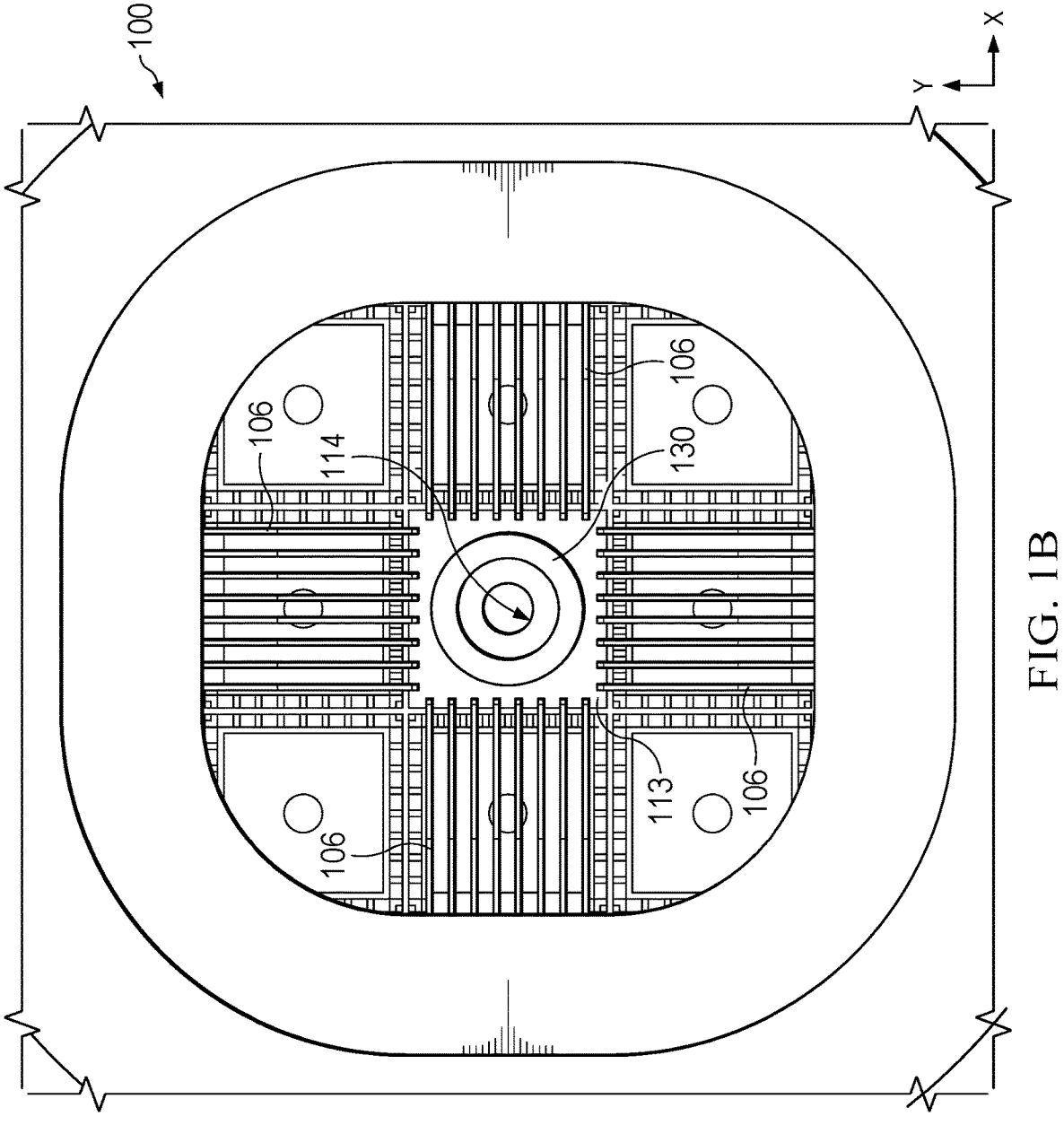
FIG. 1B is a partial bottom perspective view of the electrical probe needles and fluid probe in the wafer probe test system of FIG. 1.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Described examples provide wafer probe test systems apparatus and methods to facilitate wafer level (e.g., wafer probe) testing of sensor circuitry of a semiconductor wafer using an electrical probe to contact one or more conductive features of the wafer as well as a fluid probe to engage the surface of the wafer and form a fluidic seal between a sensor face on the surface of the wafer and the conductive feature of the wafer. Example fluid probes have a multichannel tube with first and second channels that create a flow of fluid across the sensor face on the surface of the wafer. The example wafer test apparatus and techniques allow wafer yield assessment using a localized fluidic probe to characterize sensor performance during localized fluid exchange with a sensor face (e.g., sensor area) along the surface of the wafer while keeping the bond pads or conductive pillars or posts dry.

The described solutions facilitate high volume scalability with automated wafer probe test systems to evaluate multiple sensors in respective die or device locations of a processed wafer with reproducible stable testing conditions for each device. The fluid probe allows separation of the active sensor face of the probed wafer from the probed conductive wafer features used to form electrical connections during testing. The described systems and apparatus provide advantages in terms of scalability and repeatability compared to electrolyte droplet approaches in which the droplets leave residue on the sensor area and evaporation changes the concentration of electrolyte droplet. Moreover, droplet approaches do not allow fluidic exchange or controlled fluid flow during testing. The described systems have advantages and additional benefits compared with use of gel-based approaches that use highly viscous gel electrolyte to keep the bond pads dry during testing and which cannot test using multiple types of electrolytes in a timely fashion. The multichannel tube with first and second channels that create a flow of fluid across the sensor face on the surface of the wafer in described examples also facilitates reproducible and scalable automated low-cost testing compared with use of a fluidic probe manufactured from expensive polydimethylsiloxane (PDMS) which material absorbs water.

Figure 1C:
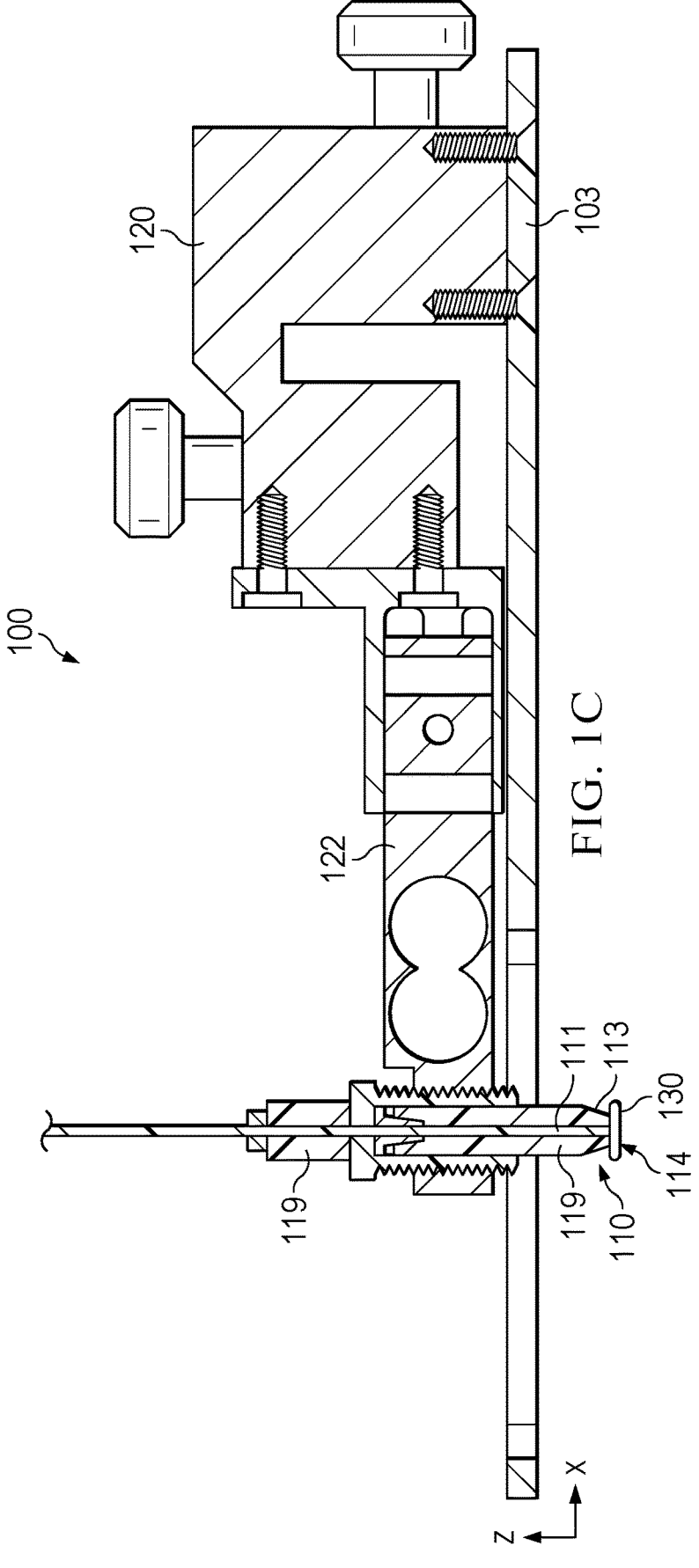
FIG. 1C is a partial sectional side elevation view of one implementation of the fluid probe in the wafer probe test system of FIG. 1.
Figure 1E:
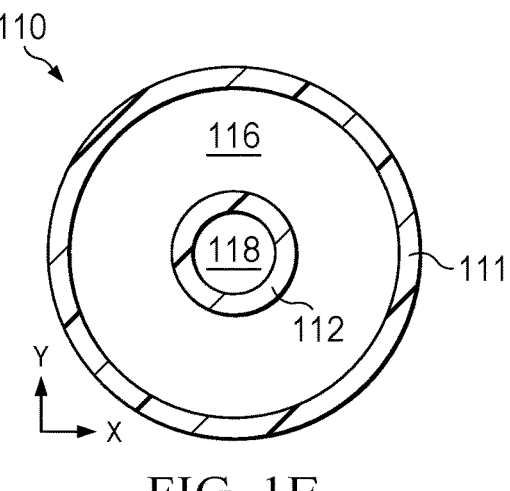
FIG. 1E is a partial sectional top plan view taken along line 1E-1E of one implementation of a multichannel tube in the fluid probe of FIG. 1D.

FIGS. 1-1E show a wafer probe test system 100 that performs automated tests on individual prospective die or device areas of a wafer 101 supported in a chuck 102. The wafer probe test system 100 is shown in an example position in a three-dimensional space with respective first, second, and third mutually orthogonal directions X, Y, and Z, in which the probed surface of the wafer 101 extends in an X-Y plane and the wafer is probed along the third direction Z. The system 100 in one example is fully automated with automated positing and fluid control systems as well as automated electrical test systems that are programmed or otherwise configured to perform automated wafer probe testing. The wafer probe test system 100 has fluid probe components mounted on a support structure or base 103. A probe card 104 provides electrical interconnections for conductive probe needles 106 and test circuitry (not shown) via a printed circuit board edge connector 108 and cables 109 as shown in FIG. 1. The probe needles 106 are positioned on the probe card 104 and extend downward toward the upper surface of the wafer 101. The system 100 includes position control apparatus (not shown) to move the chuck 102 and the wafer 101 in the respective first, second, and third directions X, Y, and Z relative to the fluid probe support structure 103 and the conductive needles 106, for example, to sequentially perform wafer probe tests of sensor circuitry on or in respective die or device locations of the wafer 101.

The wafer probe test system 100 further includes a fluid probe 110 that has a multichannel tube 111. As best shown in FIGS. 1D and 1E, the multichannel tube 111 in one example is a concentric configuration of two cylindrical hollow tube structures including an outer tube and an inner tube 112. As shown in FIG. 1D, the lower end of the inner tube 112 is spaced along the third direction Z from the end of the outer portion of the multichannel tube 114 by a non-zero spacing distance D1. The fluid probe 110 in this example has a tapered end 113 and an opening 114 that faces the probed top side of the wafer 101. As shown in FIG. 1, the fluid probe 110 has a fluidic connector 115 adapted to allow connection of tubes or tubing (not shown) between inlet and outlet fluid containers and the multichannel tube 111. The multichannel tube 111 has an annular first channel 116 and a circular second channel 118. In the example of FIGS. 1-1E, the fluid probe 110 includes an adapter 119 having the tapered end 113 and a cavity. The multichannel tube 111 extends in the cavity of the adapter 119. The adapter 119 provides fluidic connection between the opening 114 and the channels 116 and 118 of the multichannel tube 111. The adapter 119 is supported on the fluid probe support structure 103 by a base 120 with a force sensor 122. The fluid probe 110 in FIGS. 1-1E also includes a gasket 130, such as an o-ring that engages the tapered end 113 of the adapter 119 and engages a surface of a tested wafer 101 and provide fluidic connection between and encircled portion of the wafer surface and the opening 114 of the fluid probe 110.

In one implementation, the probe card 104, the conductive probe needles 106, and the fluid probe 110 are stationary, and the position control apparatus is configured to move the wafer chuck 102 and an installed wafer 101 in one or more of the X, Y, and Z directions. As best shown in FIG. 1D, the position control apparatus engages a selected die area 140 of a wafer 101 that has multiple prospective die areas that are subsequently separated from the wafer 101 as respective semiconductor dies for subsequent packaging. In operation in one example, the position control apparatus sequentially positions the wafer 101 for fluidic and electrical engagement to perform one or more electrical tests, followed by disengagement along the third direction Z and movement in the X and/or Y directions to the next tested die area 140 of the wafer 101. In this manner, the wafer probe test system 101 automatically performs wafer probe testing of multiple prospective die areas 141 of a tested wafer 101 installed in the wafer chuck 102.

The selected die area 140 includes a sensor face 141 along the top surface of the wafer 101, as well as peripheral portions 142 that are laterally outward of and surround the sensor face 141. The peripheral portions 142 in the illustrated example include conductive features 144, such as copper, aluminum, or other conductive metal bond pads for wire bond connections or conductive metal pillars or posts for flip chip connections during packaging. In the illustrated implementation, the peripheral portions 142 and the conductive features 144 substantially encircle the sensor face 141 in an X-Y plane of the first and second directions. In another example, the conductive features 144 are laterally spaced apart from the sensor face 141 without encircling the sensor face 141.

FIG. 1D illustrates the wafer 101 positioned for engagement by the conductive probe needles 106 and the fluid probe 110. In this position, the gasket 130 engages the surface of the wafer 101 with the lower end of the multichannel tube 111 spaced apart from the surface of the wafer 101 by a non-zero spacing distance D2. The gasket 130 in this example forms a fluidic seal between the sensor face 141 on the surface of the wafer 101 and the conductive features 144 of the selected die area 140 of the wafer 101. The positioning of the wafer 101, moreover, concurrently engages the conductive needles 106 with respective ones of the conductive features 144 of the selected die area 140 to form an electrical connection between the probed conductive features 144 and test circuitry of the wafer probe test system 100.

In operation, the fluid probe 110 engages the surface of the wafer 101 to form a fluidic seal between a sensor face 141 on the surface of the wafer 101 and the conductive feature 144 of the wafer 101, and the first and second channels 116 and 118 create a flow of fluid across the sensor face 141 on the surface of the wafer 101. With the fluidic seal formed by engagement of the fluid probe 110 to the wafer surface and the electrical engagement of the conductive needles 106, the wafer probe test system 100 automatically provides fluid flow from the inlet channel 118 across at least a portion of the sensor face 141 of the wafer 101, with the fluid flowing back through the outlet channel 116 of the multichannel tube 111. This provides flow of fluid suitable for actuation of sensor circuitry of the tested die area 140. The wafer probe test system 100 activates electrical test circuitry (not shown) to electrically test operation of sensor circuitry of the probed die area 140 concurrently while the fluidic probe apparatus provides selected fluid flow across at least a portion of the sensor face 140. During testing in one example, the test circuitry senses a voltage of fluid using a sense electrode, such as a silver wire (e.g., 530 in FIG. 5A below) to evaluate operation of the sensor circuitry of the tested die area 140. In this or other examples, the wafer probe test system 100 changes to a flow of a second fluid across the sensor face without disengaging the fluid probe 110 from the surface of the wafer 101.

In one or more implementations, the force sensor 122 detects the force applied by engagement of the fluid probe 110 with the wafer surface to sense engagement of the fluid probe 110 and the surface of the wafer 101. The wafer probe test system 100 includes monitoring circuitry (not shown) that determines engagement anomalies that may indicate a fluid spill or improper fluidic engagement during testing based on an output signal from the force sensor 122. In this or another example, the wafer probe test system 100 further includes pressure sensors and/or optical sensors for detection and/or remediation of detected fluid spells, as discussed further below in connection with FIG. 4. In these or other examples, the wafer probe test system 100 is also configured to automatically discontinue fluid flow and electrical testing, create a vacuum at the opening 114 and translate the wafer 101 in the wafer chuck 102 in a predetermined pattern (e.g., scanning in the X and/or Y directions) in order to clean up any detected fluid spills that may have occurred during wafer probe testing, after which the system resumes automated wafer probe testing. The wafer probe test system 100 can include various flow rate sensors, valves, and flow rate control apparatus tailored, in combination with the inlet and outlet channel sizes to achieve a desired flow direction, flow rate, and flow pattern across the sensor face 141 for testing the sensor circuit of a given die area 140 of the wafer 101, and the flow characteristics at the sensor face 141 can be dynamically changed during testing.

In one example, the wafer probe test system 100 includes a SUSS PA 200—Semiautomatic Probe System, an Agilent E5250A Low-leakage Switch Mainframe, a personal computer with Agilent or Keysight VEE software, an HP 6CH 4142B HPSMU, an HP8114A pulse generator, an HTT Probecard 5" PCB with 24 W needles, a Rucker & Kolls Model 222 PROBE MICRO-POSITIONER, Duran Pressure Plus Protect Bottles 11 & 0.51 l, Duran HPLC Bottle Caps (554-3002), 5× SMC ¼ 28" 3-Port Solenoid 12V (LVM105RY-6C2U-3-Q), an IDEX Rheodyne 6-Port Selection Valve (MXX777-605), a multichannel tube 111 that includes ⅛" and 1⁄16" ETFE & PTFE tubing with a 1⁄16" OD & 1.0 mm ID PEEK tube and an inner 1⁄32" OD & 0.5 mm ID PEEK tube, as well as a Gas Pressure Regulator, a Sensorex Flow Cell+pH Elektrode (SENS970282, 662-1381), an Edaq ET072-1 Leakless Miniature Ag/AgCl Reference Electrode, WPI FlexREF Dri-Ref™ reference electrodes, a HUG EPDM70 Micro O-Ring 1.5 mm×1.0 mm, a 6×DFRobot Weight Sensor Module SEN0160, 3× Honeywell 26PCDFM6G Pressure Sensors ±30 PSI, an Alfa Aesar Ag Wire 5 m, 0.25 MM, 99.99%, Merck Certipur (e.g. 1.09475.9010) Buffers pH2, pH4, pH7, pH9, pH10 101 Titripac, a Merck KCl 3M AVS TITRINORM, and IDEX low pressure PEEK & ETFE unions, fittings, valves, manifolds, adapters.

Figures 1F, 1G:
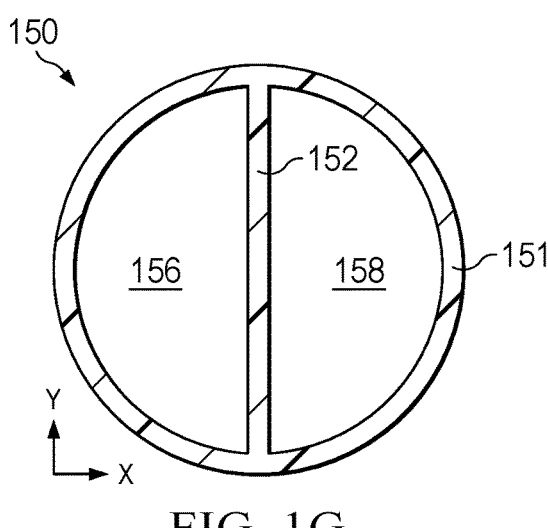
FIG. 1F is a partial sectional side elevation view of another implementation of a fluid probe and conductive probe needles engaging a wafer in the wafer probe test system of FIG. 1.
FIG. 1G is a partial sectional top plan view taken along line 1G-1G of another implementation of a multichannel tube in the fluid probe of FIG. 1F.

FIGS. 1G-1L show further non-limiting examples of suitable multichannel tubes that can be used in the wafer probe test system 100. In various implementations, the multichannel tube directly engages the surface of the tested wafer 101. In other implementations, the end of the multichannel tube is spaced apart from the wafer surface, and the fluidic probe 110 forms the fluidic seal by engagement of other features with the wafer surface, such as through a direct engagement of a tapered or non-tapered end of an adapter that supports the multichannel tube and/or engagement of an associated gasket with the wafer surface. FIGS. 1F and 1G illustrate one example, in which the fluidic probe 110 includes a bifurcated multichannel tube 151 with an interior baffle 152 that separates an outlet channel 156 and an inlet channel 158. As shown in FIG. 1F, the baffle 152 in this example is spaced apart from the end of the multichannel tube 151 by a non-zero spacing distance D1 to allow fluid to flow in the channels 156 and 158 and create fluid flow across at least a portion of the sensor face 141 of the selected die area 140 of the wafer 101. In this example, the multichannel tube 151 includes an opening 154 at a lower end thereof that directly engages the surface of the tested wafer 101.

Figure 1H:
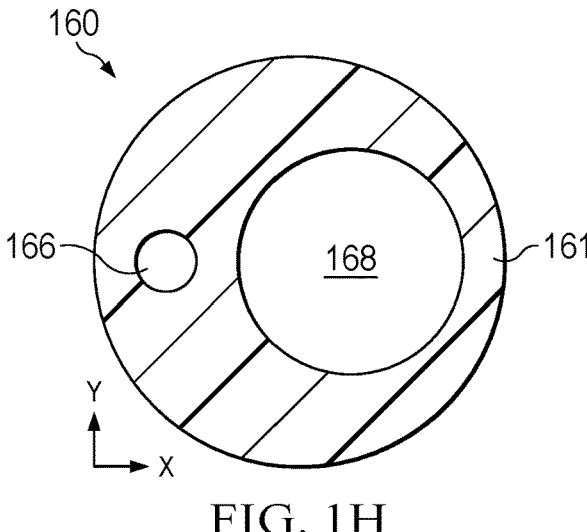
FIG. 1H is a partial top view taken of another multichannel tube implementation in the fluid probe of FIG. 1F.
Figure 1I:
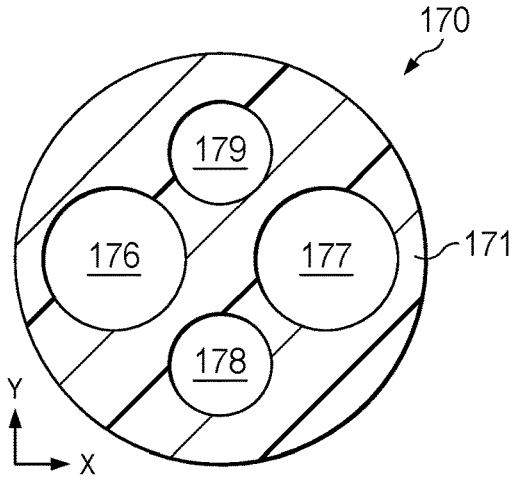
FIG. 1I is a partial top view taken of another multichannel tube implementation.
Figure 1J:
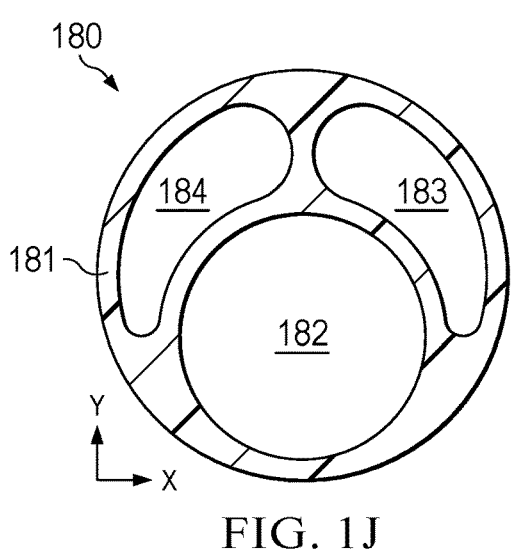
FIG. 1J is a partial top view taken of another multichannel tube implementation.
Figure 1K:
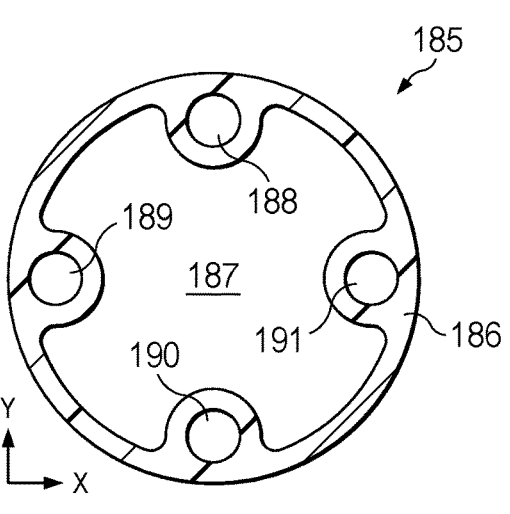
FIG. 1K is a partial top view taken of another multichannel tube implementation.
Figure 1L:
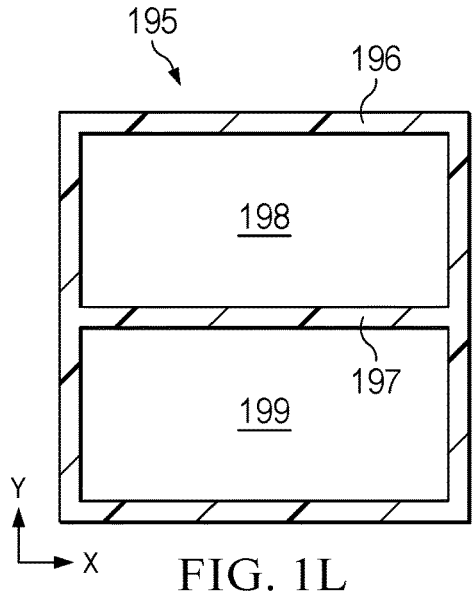
FIG. 1L is a partial top view taken of another multichannel tube implementation.

FIGS. 1H-1L illustrate the ends of further example multichannel tubes, such as multi-lumen tubes or tubes within a tube structures, which can be installed in a tapered or non-tapered adapter (e.g., adapter 119 of FIGS. 1, 1C and 1D above) with the end of the multichannel tube spaced apart from the engaged wafer surface and other features forming the seal between the sensor face 141 and the conductive features 144 (e.g., the end of the adapter and/or an installed gasket, not shown). FIG. 1H shows an example fluidic probe 160 having a multichannel tube 161 with a small first channel 166 and a larger second channel 168 that are not concentric to the axis of the multichannel tube 161. FIG. 1I shows another example fluidic probe 170 having a multichannel tube 171 with four channels 176, 177, 178, and 179. In this example, the channels 176 and 177 have larger diameters than the channels 178 and 179. FIG. 1J shows a fluidic probe 180 that includes a multichannel tube 181 having a cylindrical or circular channel 182, as well as noncircular channels 183 and 184. FIG. 1K shows a further example fluidic probe 185 with a cylindrical multichannel tube 186 that has a central cross-shaped channel 187 as well as smaller peripheral circular channels 188, 189, 190, and 191. FIG. 1L shows another example fluidic probe 195 having a rectangular multichannel tube 196 with an internal baffle 197 that separates a rectangular first channel 198 and a rectangular second channel 199. Many different shapes and types of multichannel tubes can be used in other examples with similar or different channel shapes and positions.

The multichannel tubes can be made from a variety of different materials, for example, chemically inert materials that do not affect the properties of the fluids being used to test the sensor face 141. In certain examples, the multichannel tube (e.g., 111 above) is or includes fluorinated polymers, such as polytetrafluoroethylene (PTFE), ethylene tetrafluoroethylene (ETFE), ethylene chlorotrifluoroethylene (ECTFE), polychlorotrifluoroethylene (PCTFE or PTFCE), fluorinated ethylene propylene (FEP), polyvinylidene fluoride (PVDF), perfluoroalkoxy alkanes (PFA), polyvinyl chloride (PVC), polypropylene (PP), polyethylene or polythene (PE). Other examples include tygon, neoprene, polyurethane, stainless steel, glass/silica/pyrex tubing and less flexible polyether ether ketone (PEEK). The use of the gasket 130 facilitates use of more rigid multichannel tubes such as glass or stainless steel. In various implementations, such as tube-in-a-tube configurations, different tubing materials can be mixed and matched, for example, with a flexible tube inside a more rigid tube, etc.

Figure 2:
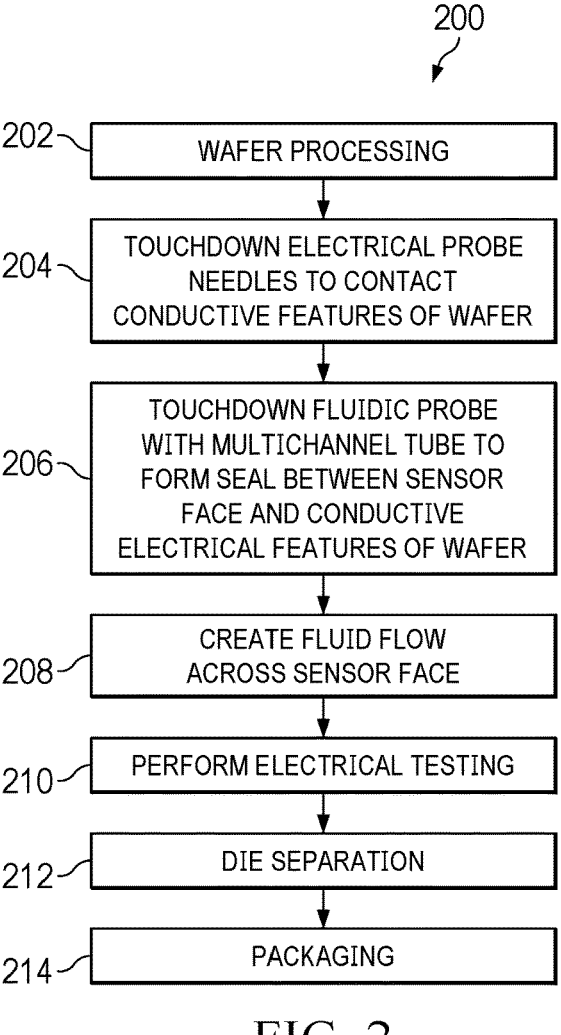
FIG. 2 is a flow diagram of a method of fabricating an electronic device.

FIG. 2 shows a method 200 of fabricating an electronic device. Wafer processing is performed at 202, including fabrication of transistors, passive electronic components, and electrical connections to form a sensor circuit in respective die areas 140 of a semiconductor wafer, including conductive electrodes or other features exposed along a side surface of the wafer in respective sensor face areas 141. The processed wafer is then installed in a chuck or other supporting structure of the wafer probe test system (e.g., wafer chuck 102 in the system 100 above) with the sensor face areas 141 exposed. At 204, the wafer probe test system 100 positions the wafer chuck 102 with a selected sensor face 141 positioned beneath the electrical and fluid probe apparatus and raises the wafer 101 for engagement referred to as a touchdown operation. The engagement at 204 causes the conductive electrical probe needles 106 to contact the conductive features 144 of the selected die area 140. In one example, the touchdown operation also engages the fluidic probe 110 with the multichannel tube 111 to form a seal between the sensor face 141 and the conductive electrical features 144 of the wafer. The electrical engagement at 204 and the fluidic engagement at 206 can be separate operations or can occur concurrently in various implementations.

The method further includes creating a flow of fluid across the sensor face 141 on the surface of the wafer 101 at 208 using a multichannel tube 111 of the fluid probe 110. At 210, the method includes performing an electrical test of a sensor circuit of the wafer 101 using the conductive needles 106 while the fluid flows across the sensor face 141 on the surface of the wafer. The method may include further iterations, for example, to sequentially reposition the wafer chuck and perform similar testing of other die areas 140 of the wafer 101. The wafer is then singulated or separated at 212 into individual semiconductor dies, which are then packaged at 214 to produce corresponding packaged electronic devices (e.g., integrated circuits). In one implementation, the method 200 also includes changing to a flow of second fluid across the sensor face 141 without disengaging the fluid probe 110 from the surface of the wafer 101. In this or another example, the method also includes changing a flow rate or pattern during a given electrical test without disengaging the fluid probe 110 from the wafer surface. In these or other implementations, the method also includes detecting a fluid spill using an optical sensor (e.g., the optical sensor 404 discussed below) and/or using a pressure or flow sensor. In these or other examples, the method can also include cleaning a detected fluid spill using the multichannel tube 111. In these or other examples, the spill detection may include sensing engagement of the fluid probe 110 and the surface of the wafer 101 using a force sensor (e.g., sensor 122) coupled to the fluid probe 110.

Figure 3:
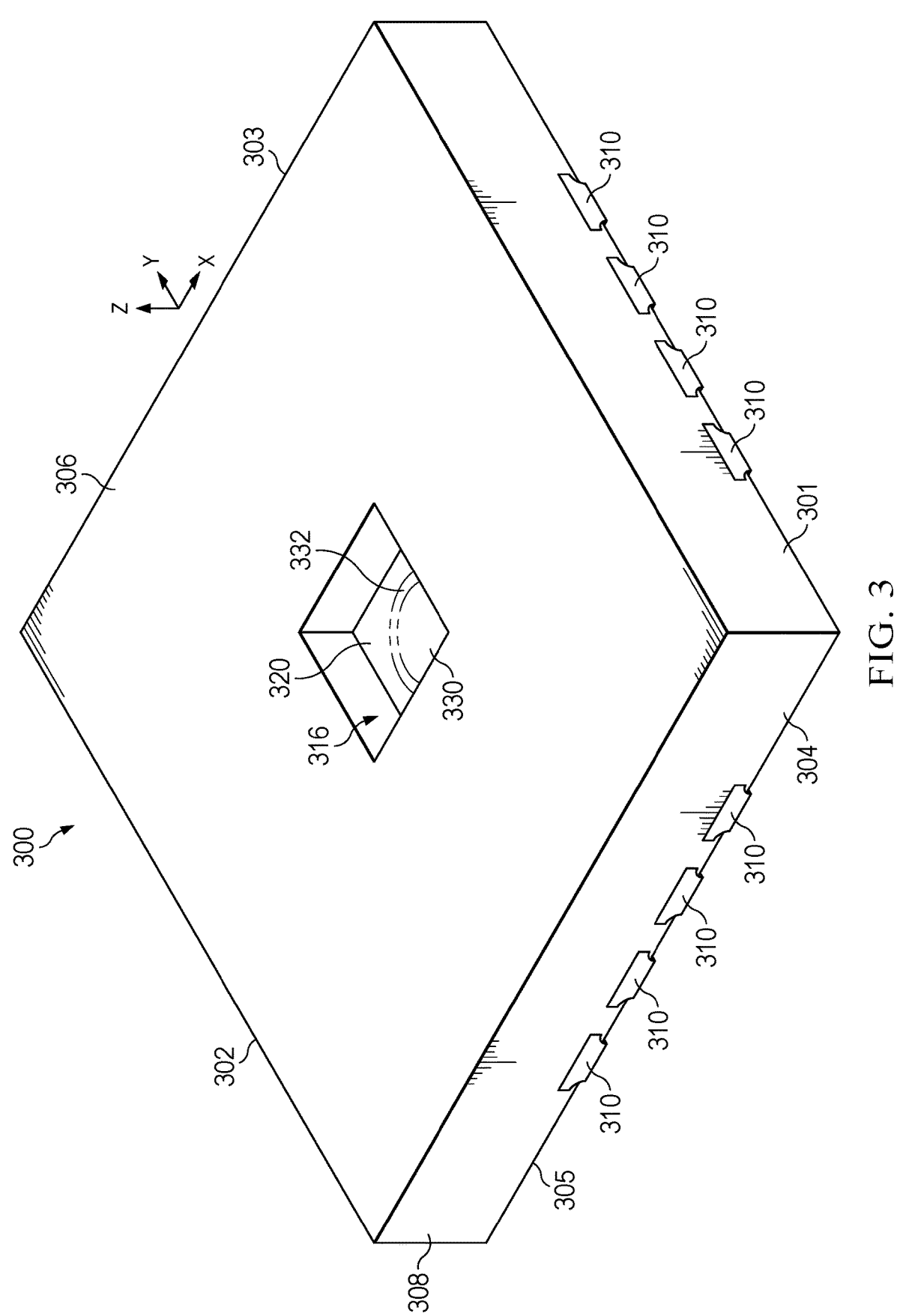
FIG. 3 is a top perspective view of an electronic device having a sensor circuit.

FIGS. 3-3C show an electronic device 300 having a sensor circuit with a sensor face exposed through an opening in a package structure to sense a condition of a fluid, for example, a corrosion sensor that can be installed in a pipe or other flow path to detect pipe material corrosion resulting from the fluid flow therein. In another example, the electronic device 300 includes a pH sensor with a sensor face exposed to sense a pH of a fluid. The electronic device 300 is shown in an example position in a three-dimensional space with respective first, second, and third mutually orthogonal directions X, Y, and Z. The electronic device 300 has opposite first and second sides 301 and 302 that are spaced apart from one another along the first direction X and extend along the second direction Y. The electronic device 300 also includes third and fourth sides 303 and 304 spaced apart from one another along the second direction Y, as well as a bottom side 305, and a top side 306 that is spaced apart from the bottom side 305 along the third direction Z. The electronic device 300 includes a molded package structure 308 that includes the sides 301-306. In the illustrated example, the bottom and top sides 305 and 306 are generally planar and extend in respective X-Y planes of the first and second directions X and Y. The electronic device 300 includes conductive leads 310 (e.g., copper) along the lateral sides 301-304 to form a quad flat no-lead (QFN) package structure. In another implementation the electronic device 300 has conductive leads on two opposite sides to provide a dual flat no-lead (DFN) package structure (not shown). In other implementations, the electronic device 300 includes leads of a different form, such as gullwing leads, J-leads, etc. (not shown), that extend at least partially outward from the package structure 308.

Figure 3A:
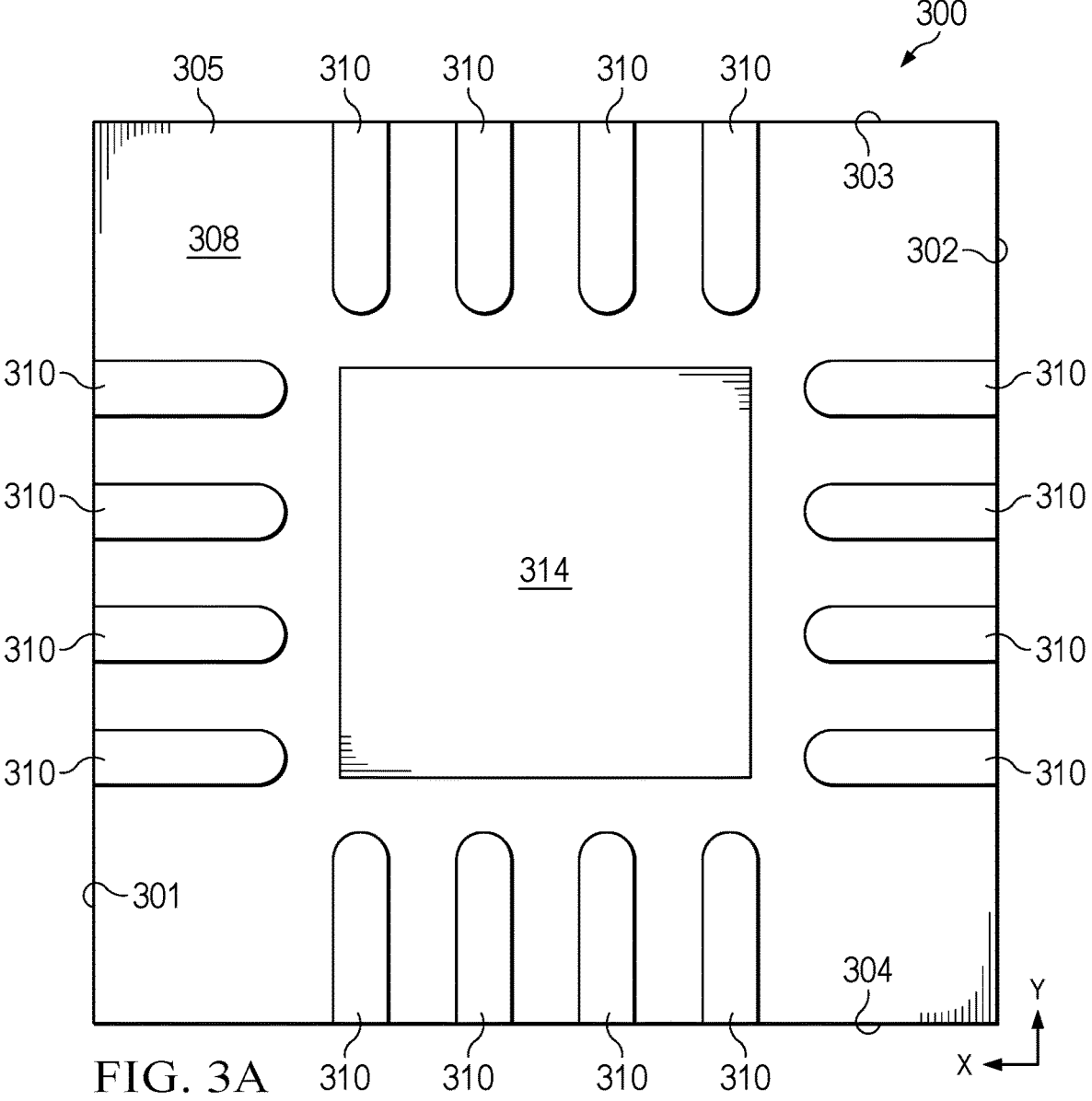
FIG. 3A is a bottom view of the electronic device of FIG. 3.

As shown in FIGS. 3A and 3B, the example electronic device 300 includes a conductive (e.g., copper) die attach pad 314 that is exposed along the bottom side 305 of the package structure 308, for example, to facilitate removal from a semiconductor die 320 that is at least partially enclosed by the package structure 308. Conductive bond pads of the semiconductor die 320 are electrically connected via bond wires 322 to respective ones of the conductive leads 310. As further shown in FIGS. 3, 3B, and 3C, the semiconductor die 320 has a top surface 330 that is exposed through an opening 316 in the top side 306 of the package structure 308. The semiconductor die 320 includes conductive features (e.g., copper bond pads 144 illustrated and described above) with electrical connections to a sensing circuit in the semiconductor die 320. The illustrated example includes conductive features along a first portion of the die surface 330, and a sensor face (e.g., sensor face 141 described above) on a second portion of the die surface 330. The package structure 308 encloses the conductive features of the semiconductor die 320 and exposes the second portion of the die surface 330 as well as a third portion of the die surface 330 between the first and second portions of the die surface 330. The sensor face in the illustrated example is exposed outside the package structure 308 by a top side opening 316. In another example, the sensor face of the semiconductor die 320 is exposed outside another side or portion of the package structure 308 in order to sense a condition of a fluid (not shown). The electronic device 300 in the illustrated example can be soldered with the bottom side 308 facing a host printed circuit board (PCB, not shown), and the host PCB can be mounted in a pipe, tank, or other structure that includes a fluid to be sensed.

As best shown in FIGS. 3 and 3B, the electronic device 300 includes a mark 332 on the third portion of the surface 330 of the semiconductor die 320. The mark 332 in one example is a visually or optically detectable marking that can be differentiated from other portions of the exposed die surface 330 by visual inspection and/or optical apparatus (e.g., cameras, etc.). The mark 332 is created during manufacturing (e.g., during wafer probe testing according to the method 200 above) by engagement of the gasket 130 or the adapter 119 or the multichannel tube 111 of the fluid probe during wafer probe testing, while the engaging structure forms the fluidic seal between the sensor face of the wafer and the conductive features of the wafer. The fluidic sealing engagement leaves remnant material, for example, from the gasket 130, which creates the mark 332. In one example, the mark 332 at least partially surrounds the sensor face 141. The mark 332 in one example generally corresponds to the shape of the engaging structure, such as a circular or semicircle mark 332 created by engagement with an o-ring type gasket 130. In another example, the mark 332 has a fully or partially rectangular shape (e.g., resulting from engagement with a rectangular structure of the fluidic probe 195 in FIG. 1L above) that at least partially surrounds the corresponding sensor face of the semiconductor die 320.

Figure 4:
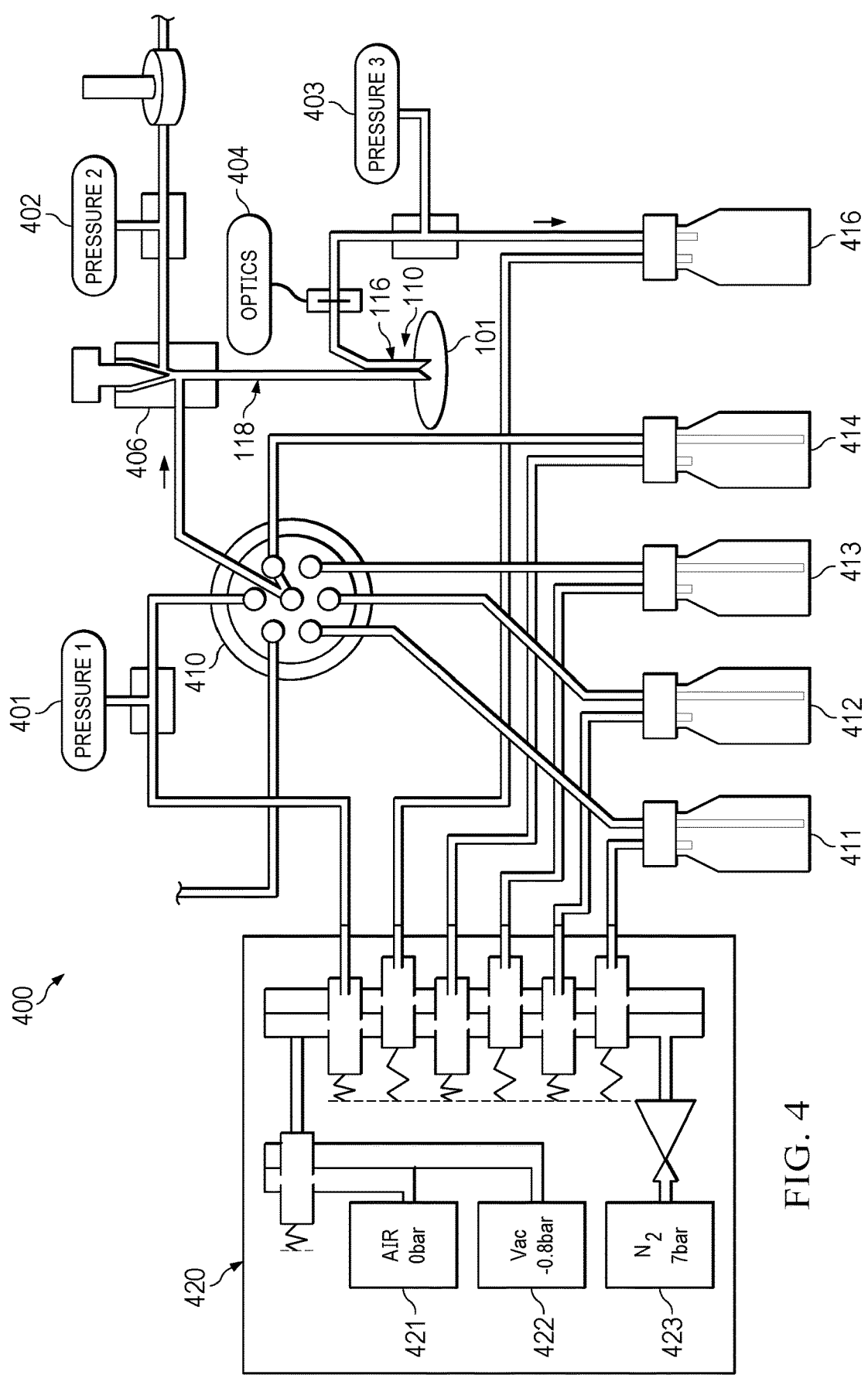
FIG. 4 is a simplified schematic diagram of an implementation of the wafer probe test system of FIG. 1.

FIG. 4 shows a schematic illustration 400 of an implementation of the wafer probe test system 100 of FIG. 1. The system shown in the diagram 400 of FIG. 4 schematically illustrates the fluidic probe 110 with the channels 116 and 118 of the multichannel two 111 shown as respective outlets and inlets for the fluidic engagement to the wafer 101. The system in this example includes pressure sensors 401, 402 and 403 for sensing pressure and/or flow of fluids in associated fluidic paths. In addition, the illustrated example includes an optical sensor 404 coupled to the fluid outlet to optically detect bubbles in the flow from the outlet channel 116 to a corresponding outlet receptacle container or bottle 416. In one example, the presence of bubbles can be used to detect a suspected fluid spill during testing.

As described above, the first channel 116 and the second channel 118 are configured to create a flow of fluid across the sensor face on the surface of the wafer 101, with the inlet channel 418 connected to a flow splitter 406 and a selector valve 410. The flow splitter 406 creates a split stream from the inlet to electrically connect a reference electrode with the wafer surface. The system also includes four inlet fluid source containers or bottles 411, 412, 413, and 414 individually having outlets connected to corresponding ports of the selector valve 410, as well as inlets coupled to corresponding ports of a solenoid system 420. The solenoid system 420 includes an air supply at atmospheric pressure (e.g., 0 bar), a vacuum system 422 that provides a negative pressure (e.g., −0.8 bar), and an N2 source 423 that provides a positive pressure (e.g., +7 bar). The selector valve 410 has a selector outlet coupled to the inlet channels 118 and multiple selector inlets coupled to respective ones of the fluid sources 411-414, and the selector valve 410 selectively couples one of the selector outlets to change the fluid provided to the sensor face 141 during wafer probe testing.

The solenoid system 420 and the selector valve 410 are operated by a host control system (not shown) for automated source fluid selection. The bypass valve 406 allows the inlet channel 408 to be isolated from the outlet of the selector valve 410, for example, during changeover of source fluid or application of vacuum to the fluidic probe 110 for wafer surface cleaning, and the solenoid system 420 facilitates selection and changing, between tests or during testing, of the source fluid to be provided to the sealed area of the wafer surface, and the system monitors the pressures sensed by the sensors 401-403 during operation.

Figure 5:
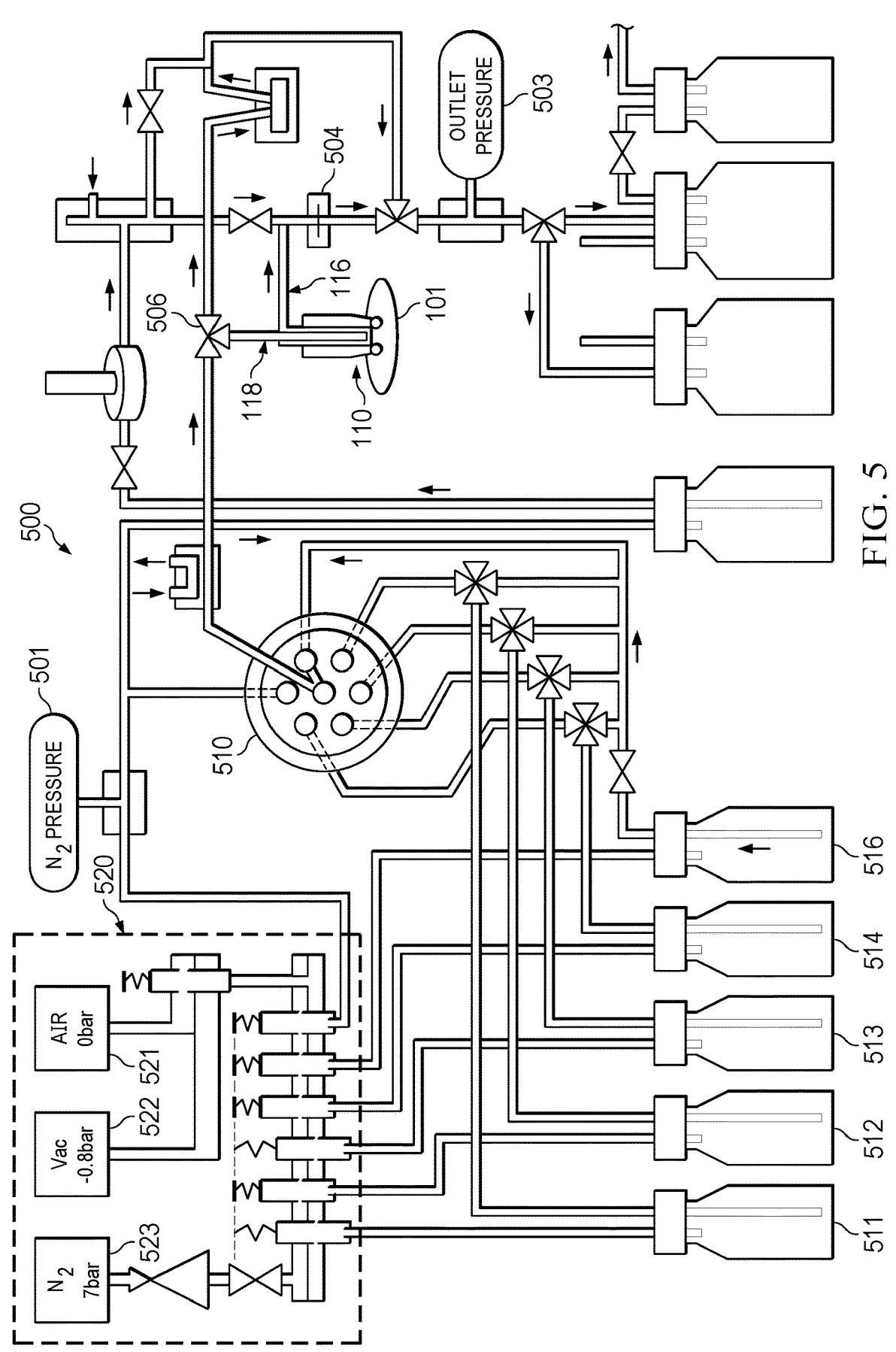
FIG. 5 is a simplified schematic diagram of another implementation of the wafer probe test system of FIG. 1.
Figure 5A:
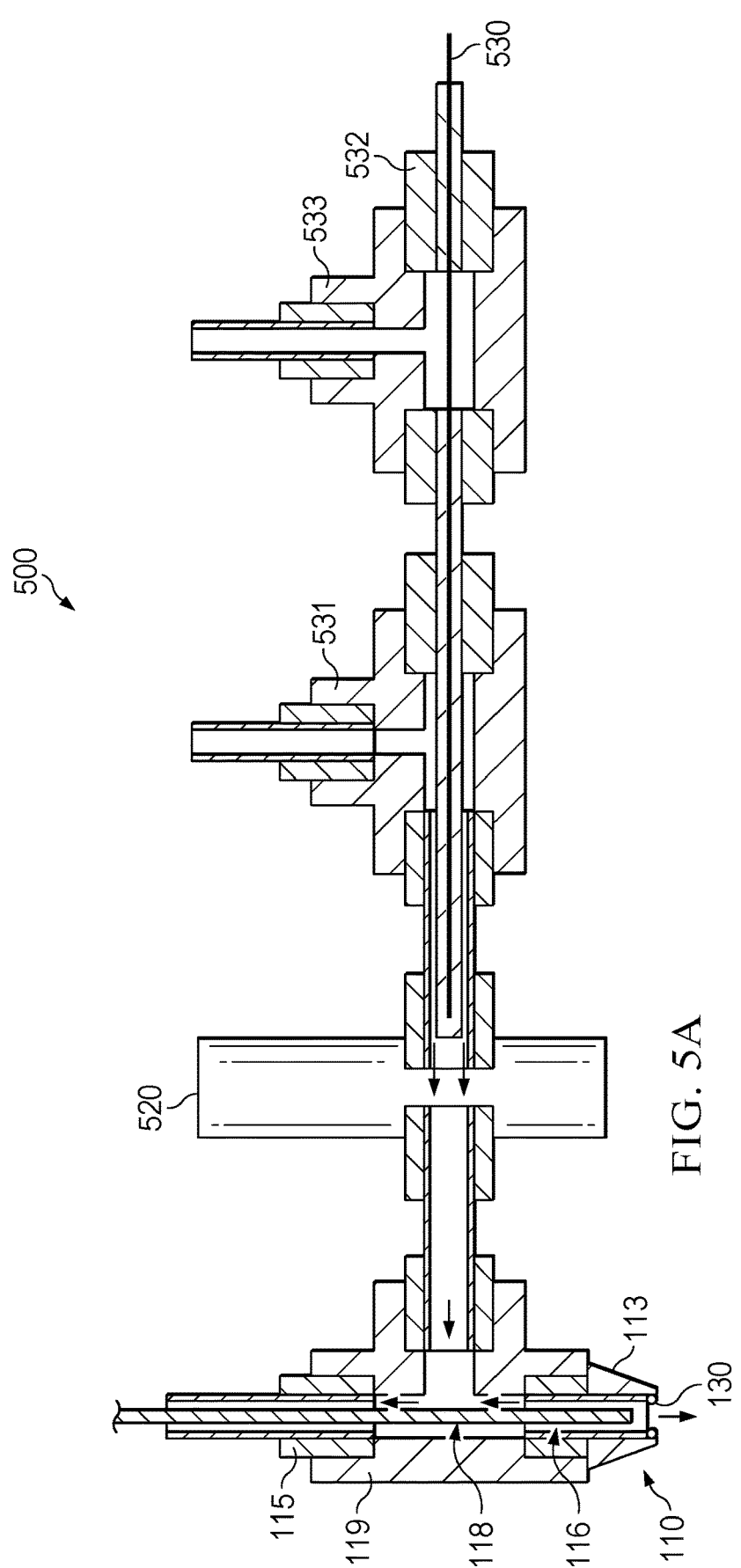
FIG. 5A is a simplified schematic diagram of a portion of the wafer probe test system implementation of FIG. 5.

FIGS. 5 and 5A show diagrams of a schematic illustration 500 of another implementation of the wafer probe test system 100 of FIG. 1. The system shown in the diagram 500 of FIG. 5 schematically illustrates the fluidic probe 110 with the channels 116 and 118 of the multichannel two 111 shown as respective outlets and inlets for the fluidic engagement to the wafer 101. The system in this example includes pressure sensors 501 and 503 for sensing pressure and/or flow of fluids in associated fluidic paths. In addition, the illustrated example includes an optical sensor 504 coupled to the fluid outlet to optically detect bubbles in the flow from the outlet channel 116 to a corresponding outlet receptacle container or bottle 516. In one example, the presence of bubbles can be used to detect a suspected fluid spill during testing.

The first channel 116 and the second channel 118 are configured to create a flow of fluid across the sensor face on the surface of the wafer 101, with the inlet channel 518 connected to a bypass valve 506 and a selector valve 510. The system also includes four inlet fluid source containers or bottles 511, 512, 513, and 514 individually having outlets connected to corresponding ports of the selector valve 510, as well as inlets coupled to corresponding ports of a solenoid system 520. The solenoid system 520 includes an air supply at atmospheric pressure (e.g., 0 bar), a vacuum system 522 that provides a negative pressure (e.g., −0.8 bar), and an N2 source 523 that provides a positive pressure (e.g., +7 bar). The selector valve 510 has a selector outlet coupled to the inlet channels 118 and multiple selector inlets coupled to respective ones of the fluid sources 511-514, and the selector valve 510 selectively couples one of the selector outlets to change the fluid provided to the sensor face 141 during wafer probe testing.

The solenoid system 520 and the selector valve 510 are operated by a host control system (not shown) for automated source fluid selection. The bypass valve 506 allows the inlet channel 508 to be isolated from the outlet of the selector valve 510, for example, during changeover of source fluid or application of vacuum to the fluidic probe 110 for wafer surface cleaning, and the solenoid system 520 facilitates selection and changing, between tests or during testing, of the source fluid to be provided to the sealed area of the wafer surface, and the system monitors the pressures sensed by the sensors 501 and 503 during operation.

As further shown in FIG. 5A, the wafer probe test system also includes a conductive electrode 530 that operates to sense a voltage of fluid in a first fluid path, and the solenoid 520 selectively couples or decouples the first fluid path and a second fluid path that is coupled to one of the inlets. In one example, the conductive electrode 530 is or includes a chloridized silver wire kept inside a non-agitated potassium-chloride (KCl)-dissolved silver solution used as a stable reference electrode to bias a voltage or potential of the fluid in the first fluid path, and when this path is fluidically coupled with the inlet of the multichannel tube 111, allows the test circuitry to measure a voltage of the electrode 530 and perform suitable testing of the electrical sensor circuitry of the wafer 101 in the presence of the fluid flow at the measured potential. A secondary reference electrode may be kept in a KCl reservoir to serve as redundant element to verify the electrochemical stability of the first reference electrode.

Described implementations facilitate stable, repeatable testing of sensing circuitry of electronic devices during wafer probe testing using a multichannel tube and fluidic probe apparatus to provide a seal that keeps the electrical probe connections (e.g., conductive features 144) dry while exposing at least a portion of a sensor face to a controlled fluid flow and facilitates use in small sensor face areas (e.g., 0.5-4.0 mm) of multiple prospective semiconductor dies at wafer probe test. Illustrated limitations integrate small fluidic probe apparatus on a micromanipulator with an associated probe card and conductive needles 106 to allow the fluidic probe apparatus to be easily installed or removed. The described systems and techniques allow wafer level characterization of electrochemical sensors using a fluidic probe in a timely cost-efficient manner during electronic device manufacturing. Reliability and reproducibility of the test setup are aided in certain implementations by choice of a multichannel tube (e.g., multi-lumen tube) of chemically resistant material and monitoring multiple parameters such as bubble detection, pressure and/or force "plug & play" force sensor solution without losing alignment. The described systems also facilitate stable and quick exchange of different kinds of fluids at the sensitive area without disengaging the fluidic probe 110. These systems and methods facilitate functional testing of electrochemical sensors and allows the study of wafer-level characterization parameters like sensitivity, hysteresis and response time, for example, during changes in the fluid source while testing.

Modifications are possible in the described examples, and other implementations are possible, within the scope of the claims.

What is claimed is:

1. A wafer probe test system, comprising: a conductive needle configured to contact a conductive feature on a surface of a wafer; and a fluid probe having a multichannel tube, the fluid probe configured to engage the surface of the wafer to form a fluidic seal between a sensor face on the surface of the wafer and the conductive feature of the wafer, the multichannel tube having a first channel and a second channel configured to create a flow of fluid across the sensor face on the surface of the wafer; and a force sensor configured to sense engagement of the fluid probe and the surface of the wafer.

2. The wafer probe test system of claim 1, wherein: the fluid probe includes an adapter and a gasket, the adapter having a cavity, and the gasket configured to engage the surface of the wafer to form the fluidic seal between the sensor face on the surface of the wafer and the conductive feature of the wafer; and the multichannel tube extends in the cavity of the adapter.

3. The wafer probe test system of claim 2, wherein the multichannel tube is spaced apart from the surface of the wafer by a non-zero spacing distance.

4. The wafer probe test system of claim 2, wherein the adapter has a tapered end and the gasket engages the tapered end.

5. The wafer probe test system of claim 1, further comprising an optical sensor coupled to a fluid outlet to detect a fluid spill.

6. The wafer probe test system of claim 1, wherein: the multichannel tube further includes a third channel; the first channel is an outlet configured to receive fluid from the sensor face on the surface of the wafer; the second channel and the third channel are inlets configured to direct fluid toward the sensor face on the surface of the wafer.

7. The wafer probe test system of claim 6, further comprising a selector valve with a selector outlet coupled to one of the second and third channels and multiple selector inlets coupled to respective fluid sources, the selector valve configured to selectively couple one of the selector outlets to change the fluid provided to the sensor face during wafer probe testing.

8. The wafer probe test system of claim 6, further comprising a conductive electrode configured to sense a voltage of fluid in a first fluid path, and a solenoid between the first fluid path and one of the channels.

9. The wafer probe test system of claim 6, wherein one of the channels is circular.

10. The wafer probe test system of claim 6, wherein one of the channels is non-circular.

11. The wafer probe test system of claim 1, wherein: the multichannel tube is cylindrical; the second channel extends along a central axis of the multichannel tube; and the first channel is an annular channel concentric with the second channel.

12. The wafer probe test system of claim 1, wherein the multichannel tube includes a fluorinated polymer.

13. A method of manufacturing an electronic device, the method comprising: engaging a conductive feature on a surface of a wafer to a conductive needle; engaging a fluid probe to the surface of the wafer to form a fluidic seal between a sensor face on the surface of the wafer and the conductive feature of the wafer; sensing engagement of the fluid probe and the surface of the wafer using a force sensor coupled to the fluid probe; using a multichannel tube of the fluid probe, creating a flow of fluid across the sensor face on the surface of the wafer; and using the conductive needle, performing an electrical test of a sensor circuit of the wafer while the fluid flows across the sensor face on the surface of the wafer.

14. The method of claim 13, further comprising changing to a flow of second fluid across the sensor face without disengaging the fluid probe from the surface of the wafer.

15. The method of claim 13, further comprising detecting a fluid spill using an optical sensor.

16. The method of claim 15, further comprising cleaning up a detected fluid spill using the multichannel tube.

* * * * *